(12) United States Patent
Sugiura

(10) Patent No.: US 6,724,263 B2
(45) Date of Patent: Apr. 20, 2004

(54) HIGH-FREQUENCY POWER AMPLIFIER

(75) Inventor: Masayuki Sugiura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/281,206

(22) Filed: Oct. 28, 2002

(65) Prior Publication Data

US 2004/0041634 A1 Mar. 4, 2004

(30) Foreign Application Priority Data

Aug. 30, 2002 (JP) ........................... 2002-254226

(51) Int. Cl.$^7$ ................................................ H03F 3/04
(52) U.S. Cl. ..................... 330/302; 330/303; 333/32
(58) Field of Search .............................. 330/302, 303, 330/306; 333/32

(56) References Cited

U.S. PATENT DOCUMENTS 5,159,287 A * 10/1992 Furutani et al. ............ 330/286
5,329,249 A * 7/1994 Cripps ........................ 330/302
5,914,641 A * 6/1999 Yun et al. ................... 330/302

FOREIGN PATENT DOCUMENTS

JP 4-77009 3/1992
JP 11-127045 5/1999

* cited by examiner

*Primary Examiner*—Henry Choe
(74) *Attorney, Agent, or Firm*—Oblon, Spivak, McClelland, Maier & Neustadt, P.C.

(57) ABSTRACT

A high-frequency power amplifier includes a transistor which is inputted with a high-frequency signal, amplifies the high-frequency signal and outputs the same; a fundamental-signal matching circuit, one end of which is connected to an output of said transistor and which matches at least the impedance of fundamental signal in the amplified high-frequency signal and outputs the same from the other end; a power supply which supplies electric power to said transistor from a node located in an interval from the output of said transistor to said fundamental-signal matching circuit; a first inductor, one end of which is connected to said power supply; a second inductor connected in series between the other end of said first inductor and said node; and a first capacitor, one end of which is connected between said first inductor and said second inductor while the other end thereof is connected to a reference potential, said first capacitor forming a first series-resonant circuit with said second inductor and a parallel-resonant circuit with said first inductor.

21 Claims, 11 Drawing Sheets

HIGH-FREQUENCY POWER AMPLIFIER

CROSS-REFERENCE TO RELATED APPLICATION

This application is based upon and claims the benefit of priority from the prior Japanese Patent Application No. 2002-254226, filed on Aug. 30, 2002, the entire contents of which are incorporated herein by reference.

BACKGROUND OF THE INVENTION

1. Field of the Invention

The present invention relates to a high-frequency power amplifier.

2. Related Background Art

The high-frequency power amplifier is used for supplying electric power to the antenna of a communication gear such as a portable terminal. The high-frequency power amplifier is required to have a high power gain and a high power efficiency and be as small as possible because it is used for the portable terminals and the like.

Recently, a high-frequency power amplifier incorporating a matching circuit has been designed. The matching circuit is used to match the impedance (normally 50Ω) of input/output between the high-frequency power amplifier and an antenna. Therefore, a small high-frequency power amplifier, which incorporates such an external circuit as the matching circuit as a module, is in demand.

To reduce the size of the high-frequency power amplifier, various kinds of methods are available, such as miniaturization of a semiconductor chip, intensification of the precision of mounting technology, refining the pattern of a module substrate. Particularly, because an output-matching circuit requires a large space, the miniaturization of the output-matching circuit provides a significant effect upon reduction of the size of the entire high-frequency power amplifier.

Figure 10:
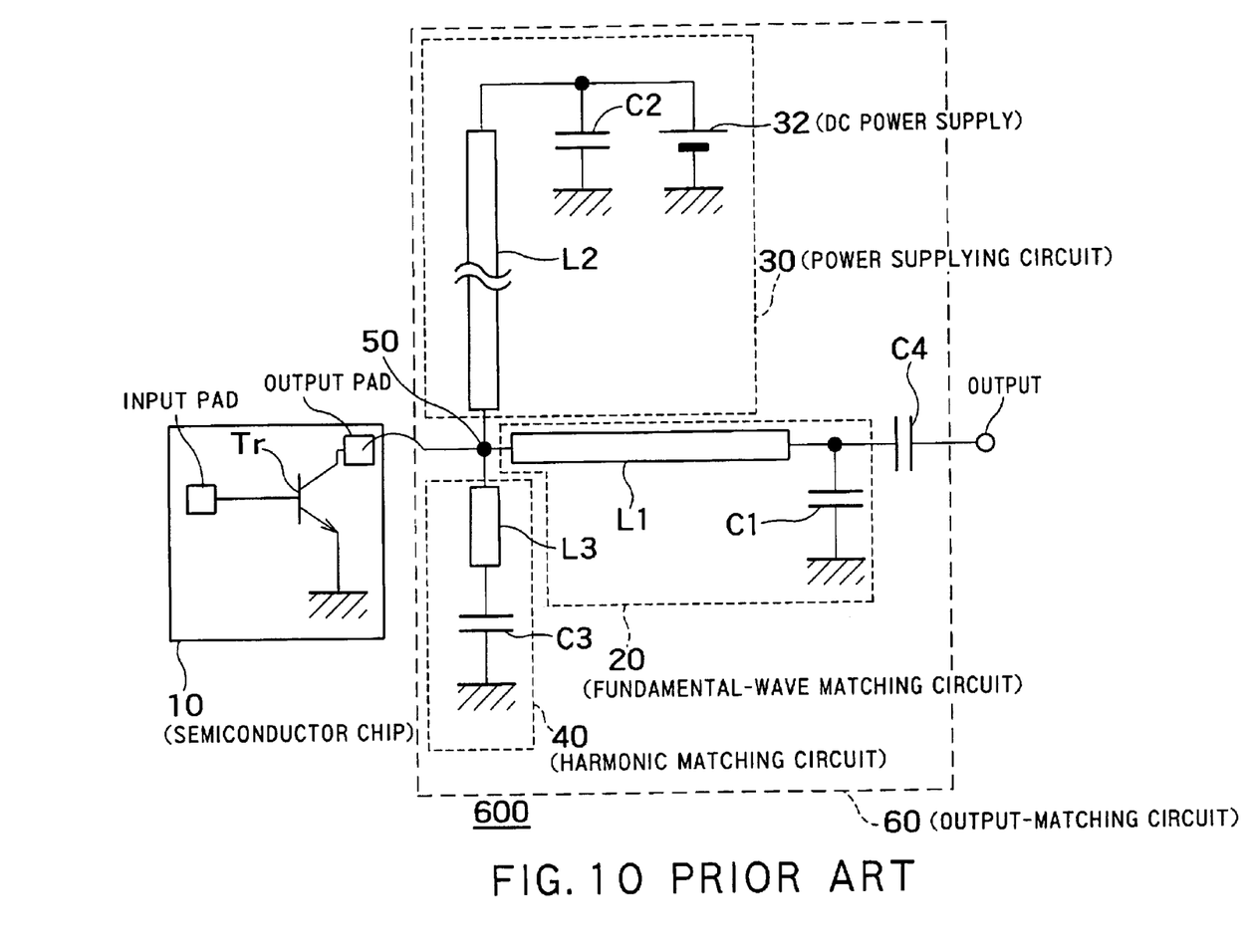
FIG. 10 is a circuit diagram of a conventionally typical high-frequency power amplifier 600.

FIG. 10 shows the circuit diagram of a conventional high-frequency power amplifier 600. Its input-matching circuit is omitted from this diagram. A fundamental signal is outputted from a transistor Tr produced on a semiconductor chip 10. The fundamental signal is matched by a fundamental-signal matching circuit 20 having an inductor L1 and a capacitor C1 formed on a substrate. Ordinarily, the fundamental-signal matching circuit 20 matches the impedance of the fundamental signal to 50 Ω and outputs the fundamental signal through the capacitor C4 for DC current block.

A power supplying circuit 30 comprises a capacitor C2, an inductor L2 and a direct current (DC) power supply 32 so as to supply power to the transistor Tr. The capacitor C2 is a decoupling capacitor provided for grounding the high-frequency signal. The inductor L2 is a so-called λ/4 line which is set to λ/4 with respect to the wavelength λ of the fundamental signal. Consequently, the inductor L2 turns to a large impedance for the fundamental signal propagated from the transistor Tr to the fundamental-signal matching circuit 20. In other wards, the inductor L2 turns to open state to the fundamental signal at a node 50 in which the power supplying circuit 30 is connected to the fundamental-signal matching circuit 20. Therefore, the power supplying circuit 30 never affects the fundamental-signal matching circuit 20. The secondary harmonic signal of an output signal from the transistor Tr is short-circuited by the inductor L2.

The high-frequency power amplifier 600 further comprises a harmonic matching circuit 40 having an inductor L3 and a capacitor C3. The tertiary harmonic signal of the output signals from the transistor Tr is short-circuited by the harmonic matching circuit 40.

If the inductor L2 (λ/4 line) is formed of a 50 Ω line and the frequency of the fundamental signal is 900 MHz, the inductor L2 needs to be about 30 mm long. Due to a demand for reduction of the size of the high-frequency power amplifier in recent years, the high-frequency power amplifier 600 including the output-matching circuit 60 is formed in the form of a square module 4 mm to 6 mm in one side. Therefore, it is very difficult to accommodate the output-matching circuit 60 having the inductor L2 about 30 mm long in the module.

When the length of the inductor L2 is shorter than 30 mm (for example, shortened to 20 mm) in order to solve this problem, the power supply circuit 30 is not in the open state to the fundamental signal because the inductor L2 is shorter than the ideal λ/4 line. Consequently, the electric loss of the output-matching circuit 60 is increased and the output impedance of the transistor Tr is changed.

When the inductor L2 is formed of a transmission line having a higher impedance than the 50 Ω line, for example, when the width of the transmission line of the inductor L2 is reduced, the influence on the fundamental signal by the power supplying circuit 30 can be reduced. However, when the width of the transmission line is decreased, the resistance component possessed by the inductor L2 is increased, and thereby the power from the DC power supply 32 is lost. As a result, the power efficiency of the high-frequency power amplifier 600 drops. Further, because the voltage drop by the inductor L2 is increased, the voltage amplitude at the operating time of the transistor Tr is limited, and thereby the linear motion of the high-frequency power amplifier 600 is disturbed, and distortion component is increased in the output signal. The linear motion is important in digital modulation system. If the high-frequency power amplifier 600 is based on the digital modulation system, the increase in the distortion component leads to a large drop in the performance of the high-frequency power amplifier 600.

Figure 11:
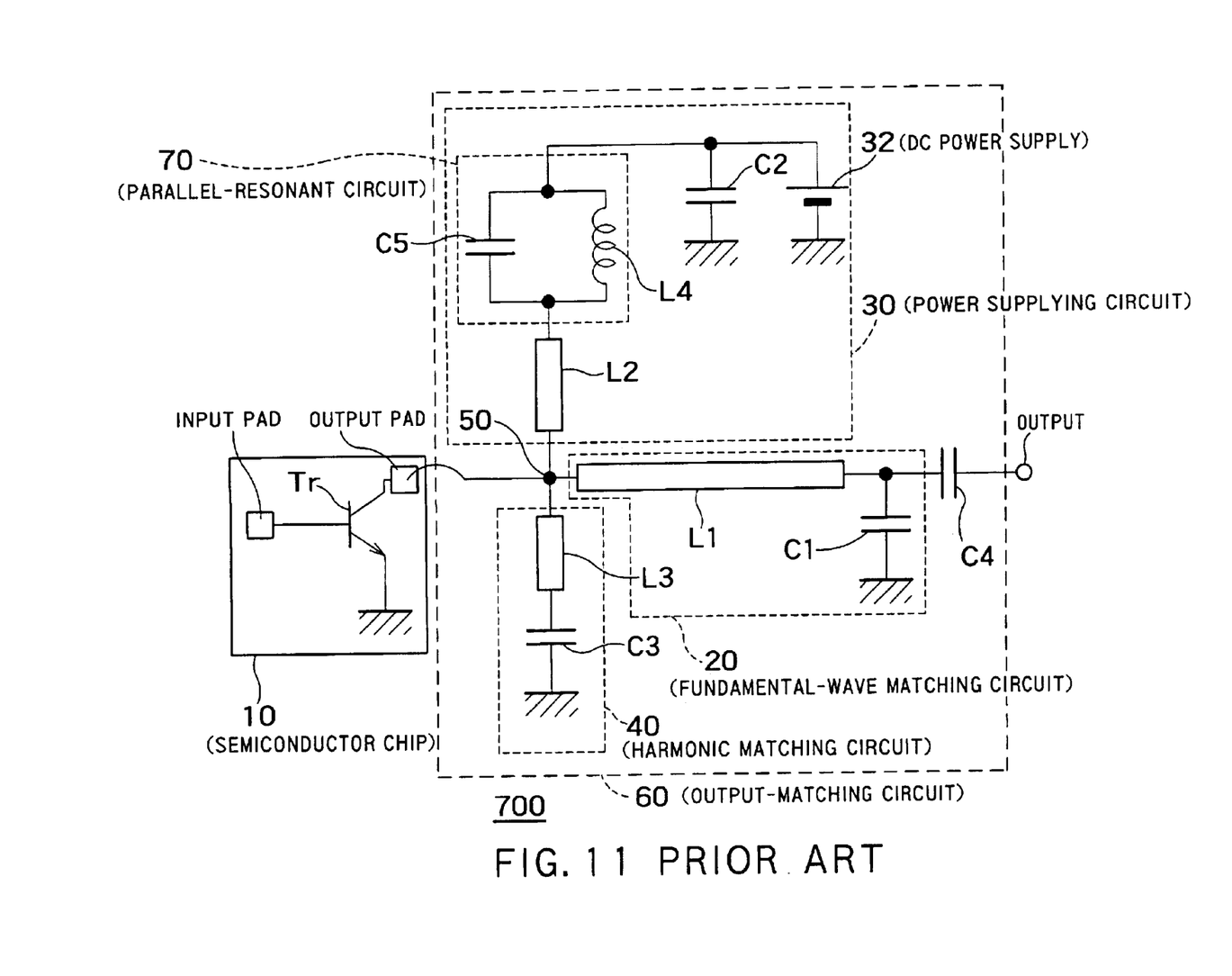
FIG. 11 is a circuit diagram of a conventional high-frequency power amplifier 700.

To solve such a problem, the high-frequency power amplifier 700 shown in FIG. 11 has been proposed. The output-matching circuit 60 possessed by the high-frequency power amplifier 700 comprises a parallel-resonant circuit 70 composed of a capacitor C5 and an inductor L4. If the resonant frequency of the parallel-resonant circuit 70 is set to the frequency (for example, assumed to be $f_0$) of the fundamental signal, the impedance of the power supplying circuit 32 as viewed from the node 50 is increased. The relation between the capacity $C_5$ of the capacitor C5, the inductance $L_4$ of the inductor L4 and the angular frequency $\omega_0$ ($=2\pi f_0$) of the fundamental signal is expressed in the expression 1.

$$L_4 = 1/(\omega_0^2 * C_5) \qquad \text{(expression 1)}$$

Because the value $L_4$ can be set smaller by increasing the value $C_5$, a small inductor can be used as the inductor L4. The inductor L2 does not have to be provided with a large inductance due to the effect of the resonant circuit. Consequently, the length of the inductor L2 can be shorter than the λ/4 line under the condition in which the power supplying circuit 32 gives no influence upon the fundamental-signal matching circuit 20. Further, because the size of the inductor L4 is small, and because the length of the inductor L2 is shorter than the λ/4 line, the high-frequency power amplifier 700 is smaller than the high-frequency power amplifier 600 and loss in DC current can be reduced.

However, in the high-frequency power amplifier 700, the power supplying circuit 30 is incapable of short-circuiting the secondary harmonic. The harmonic matching circuit 40 needs to be formed as a secondary harmonic matching circuit in order to remove the secondary harmonic from the output signal. As a result, the high-frequency power amplifier 700 is incapable of matching harmonic higher than secondary harmonic. Thus, in case of adjusting up to the tertiary harmonic like the high-frequency power amplifier 600 shown in FIG. 10, it is necessary to add other harmonic matching circuit to the high-frequency power amplifier 700. This increases the number of necessary components, which is contrary to the demand for reduction of the size. Adding another high-frequency matching circuit may cause a loss in the fundamental signal.

For the reason, there is demand for a high-frequency power amplifier having a high power efficiency and capable of matching secondary harmonic or higher order harmonic while the size thereof is smaller than the conventional example.

SUMMARY OF THE INVENTION

According to an embodiment of the present invention, there is provided a high-frequency power amplifier comprising: a transistor which is inputted with a high-frequency signal, amplifies the high-frequency signal and outputs the same; a fundamental-signal matching circuit one end of which is connected to an output of said transistor and which matches at least the impedance of fundamental signal in the amplified high-frequency signal and outputs the same from the other end; a power supply which supplies electric power to said transistor from a node located in an interval from the output of said transistor to said fundamental-signal matching circuit; a first inductor, one end of which is connected to said power supply; a second inductor connected in series between the other end of said first inductor and said node; and a first capacitor, one end of which is connected between said first inductor and said second inductor while the other end thereof is connected to a reference potential, said first capacitor forming a first series-resonant circuit with said second inductor and a parallel-resonant circuit with said first inductor.

According to another embodiment of the present invention, there is provided a high-frequency power amplifier comprising: a transistor which is inputted with a high-frequency signal, amplifies the high-frequency signal and outputs the same; a fundamental-signal matching circuit, one end of which is connected to an output of said transistor and which matches at least the impedance of fundamental signal in the amplified high-frequency signal and outputs the same from the other end; a power supply which supplies electric power to said transistor from a node located in an interval from the output of said transistor to said fundamental-signal matching circuit; a first inductor, one end of which is connected to said power supply; a second inductor connected in series between the other end of said first inductor and said node; a third inductor, one end of which is connected to said node; and a first capacitor, one end of which is connected to the other end of said third inductor while the other end thereof is connected to said reference potential, said first capacitor forming a first series-resonant circuit with said third inductor and a parallel-resonant circuit with said first inductor.

According to still another embodiment of the present invention, there is provided a high-frequency power amplifier comprising: a transistor which is inputted with a high-frequency signal, amplifies the high-frequency signal and outputs the same; a fundamental-signal matching circuit, one end of which is connected to an output of said transistor and which matches at least the impedance of fundamental signal in the amplified high-frequency signal and outputs the same from the other end; a power supply which supplies electric power to said transistor from a node located in an interval from the output of said transistor to said fundamental-signal matching circuit; a first inductor, one end of which is connected to said power supply; a second inductor connected is series between the other end of said first inductor and said node; a third inductor, one end of which is connected to the output of said transistor; and a first capacitor, one end of which is connected to the other end of said third inductor while the other end thereof is connected to said reference potential, said first capacitor forming a first series-resonant circuit with said third inductor and a parallel-resonant circuit with said first inductor.

DETAILED DESCRIPTION OF THE INVENTION

Hereinafter, the embodiments of the present invention will be described with reference to the accompanying drawings. It should be noted that the present invention is not restricted to the embodiments described here.

Figure 1:
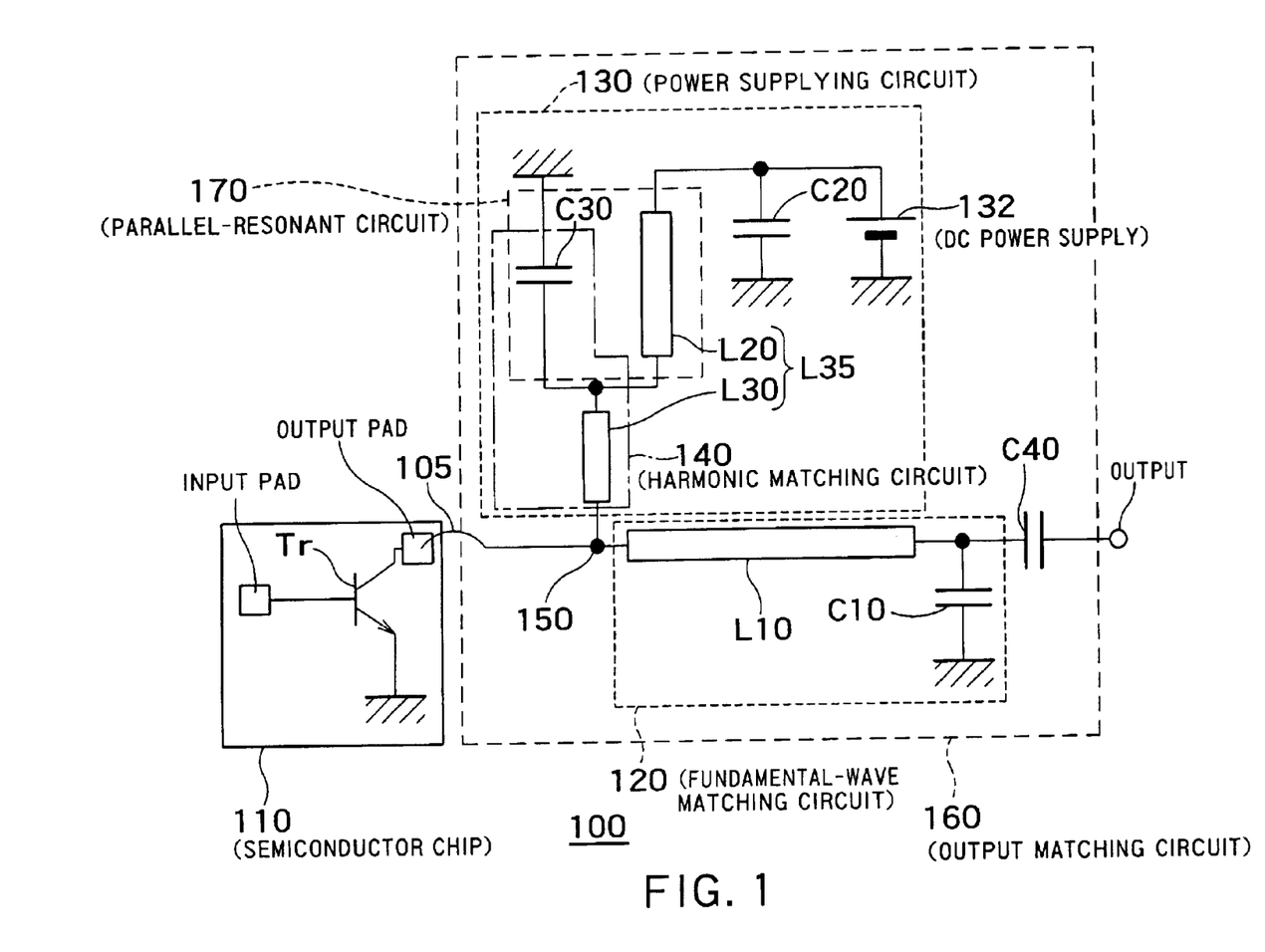
FIG. 1 is a circuit diagram of a high-frequency power amplifier 100 according to a first embodiment of the present invention.

FIG. 1 is a circuit diagram of the high-frequency power amplifier according to a first embodiment of the present invention. A high-frequency power amplifier 100 comprises a semiconductor chip 110 which is inputted with a high-frequency signal, amplifies the high-frequency signal and outputs the same. The high-frequency power amplifier 100 comprises an output-matching circuit 160 which is connected to the output pad thereof through plural gold wires 105. According to this embodiment, the semiconductor chip 110 includes a hetero junction bipolar transistor (HBT) (hereinafter referred to as transistor) Tr loaded on a GaAs substrate.

A bias supply circuit (not shown) for supplying bias to the base of the transistor Tr and an input matching circuit (not shown) for carrying out impedance matching on the input side are connected to the input pad of the semiconductor chip 110.

The output-matching circuit 160 comprises a fundamental-signal matching circuit 120 for matching the impedance of the amplified high-frequency signal for output and a power supply circuit 130 having a DC power supply 132 for supplying electric power to the transistor Tr. The high-frequency power amplifier 100 containing the output-matching circuit 160 is formed in the form of a module and on a dielectric substrate (for example, ceramic substrate formed of alumina).

The fundamental-signal matching circuit 120 contains an inductor L10 and a capacitor C10. An end of the inductor L10 is connected to the output of the transistor Tr, so that the fundamental signal (wavelength λ) is subjected to impedance matching and outputted from the other end thereof. Generally, the fundamental signal is matched to 50 Ω. The capacitor C10 is connected between the other end of the inductor L10 and the ground so as to execute impedance matching with the capacitor C10 and the inductor L10. The capacitor C10 also serves the role of a low-pass filter. Although the ground is employed as reference potential according to the embodiments described below, it is permissible to adopt other constant potential.

A capacitor (DC blocking capacitor) C40 for shutting down DC current is connected between the other end of the inductor L10 and the output of the high-frequency power amplifier 100. A high-frequency signal in a specific frequency band is outputted from the output-matching circuit 160 by the capacitor C10, the inductor L10 and the capacitor C40.

The fundamental signal from the semiconductor chip 100 is subjected to impedance matching by the fundamental-signal matching circuit 120 and outputted from the high-frequency power amplifier 100 through the capacitor C40.

The power supplying circuit 130 is connected to the node 150 located between the output pad of the semiconductor chip 110 and the fundamental-signal matching circuit 120. The power supplying circuit 130 comprises a DC power supply 132, an inductor L20, an inductor L30, a capacitor C20 and a capacitor C30.

An end of the inductor L20 is connected to the DC power supply 132 while the other end thereof is connected to an end of the inductor L30. The other end of the inductor L30 is connected to the node 150. The inductor L20 and the inductor L30 are connected in series between the DC power supply 132 and the node 150. The inductor L20 is connected to the DC power supply 132. The inductor L30 is connected to the node 150.

The capacitor C20 is a decoupling capacitor for grounding high-frequency wave, which is connected between an end of the inductor L20 and the ground. An end of the capacitor C30 is connected between the inductor L20 and the inductor L30 while the other end thereof is connected to the ground.

In the circuit shown in FIG. 1, the inductor L20 and the inductor L30 are two different transmission lines. However, preferably, the inductor L20 and the inductor L30 are integrated transmission line L35. In this case, by connecting the capacitor C30 to the halfway point of the transmission line L35, the transmission line L35 is divided into the inductor L20 and the inductor L30. Therefore, the inductance of each of the inductance L20 and the inductance L30 is determined depending on the position in which the capacitor C30 is connected to the transmission line L35. If the transmission line L35 is formed in an equal width, the inductance of each of the inductor L20 and the inductor L30 is determined depending on the length of the transmission line. Consequently, the design of the inductor L20 and the inductor L30 is facilitated.

According to this embodiment, the inductors L10, L20, L30 are transmission lines formed on a dielectric substrate. The transmission lines are, for example, strip line or micro strip line. In the case of dielectric substrate employing alumina as its dielectric, these transmission lines have a substantially the same width as the thickness of the dielectric substrate, so that the characteristic impedance can be set to about 50 Ω. Further, the capacitors C10, C20, C30 are formed by mounting a chip part 0.5 mm×1 mm in base and 0.5 mm in thickness or 0.3 mm×0.6 mm in base and 0.3 mm in thickness on a dielectric substrate.

The inductor L20 and capacitor C30 form a parallel-resonant circuit 170. The parallel-resonant frequency of the parallel-resonant circuit 170 is set to the frequency of the fundamental signal. By setting such a parallel-resonant circuit 170, the impedance of the power supplying circuit 130 to the fundamental signal with respect to the node 150 is increased. In other words, the effect of the parallel-resonant circuit 170 keeps the power supplying circuit 130 open to the fundamental signal. Consequently, the power supplying circuit 130 never affects the fundamental signal to the fundamental-signal matching circuit 20.

The inductance $L_2$ of the inductor L20 may be determined by the parallel-resonant condition or such a condition that the impedance turns open (infinite) under the frequency of the fundamental signal with respect to the node 150. For example, the relation between the angular frequency $\omega_1$ of the fundamental_signal ($\omega_1=2\pi*f_1$: $f_1$ is the frequency of the fundamental signal), inductance $L_2$ and the capacitor $C_3$ is expressed with the expression 2.

$$L_2=1(\omega_1^{2}*C_3) \quad \text{(expression 2)}$$

If as the capacity of the capacitor C30, an appropriate capacity $C_3$ usable in the chip part is selected, the inductor L20 is determined appropriately based on the expression 2.

The inductor L30 and the capacitor C30 are connected in series between the node 150 and the ground. The inductor L30 and the capacitor C30 form a harmonic matching circuit 140. The harmonic matching circuit 140 is a series-resonant circuit set up to resonate with the frequency of the nth-order harmonic. The inductor L30 and the capacitor C30 short-circuits the nth-order harmonic of the high-frequency signal outputted from the semiconductor chip 110 by means of the harmonic matching circuit 140.

The inductance $L_3$ of the inductor L30 and the capacity $C_3$ of the capacitor C30 may be determined depending on the frequency of the harmonic. For example, when the nth-order harmonic is short-circuited, the relation between the angular frequency $\omega_n$, inductance $L_3$ and capacity $C_3$ is expressed according to the expression 3. In the meantime, $\omega_n=n*\omega_1$ (n is an integer).

$$L_3=1/(n^2-1)* \omega_1^{2}*C_3) \quad \text{(expression 3)}$$

The capacitor C30 is used in common for the harmonic matching circuit 140 and the parallel-resonant circuit 170.

Therefore, because the capacity $C_3$ is already determined by the expression 2, the inductance $L_3$ is determined appropriately according to the expression 3.

For example, when short-circuiting the secondary harmonic, each capacity and inductance may be determined so as to satisfy the expressions 2, 3 under n=2. At this time, as the capacity of the capacitor C30, a usable capacity of a chip part, for example, several pF is selected. Because the value of $L_2$ decreases as the capacity value increases, the length of the inductor L20 can be set short by selecting an appropriate capacity value $C_3$. Because the length of the inductor L30 is $1/(n^2-1)$, the entire length can be shorter than the λ/4 line.

As described above, this embodiment includes the harmonic matching circuit 140 and the parallel-resonant circuit 170. Even if the length of the transmission line L35 is shorter than the λ/4 line, a sufficiently high impedance can be obtained with respect to the fundamental-signal by the parallel-resonant circuit 170 and further, the nth-order harmonic can be short-circuited by the harmonic matching circuit 140.

The sum of the lengths of the inductor L20 and the inductor L30, that is, the length of the integrated transmission line L35 can be made about ⅛ to 1/12 the wavelength λ of the fundamental signal by selecting an appropriate capacity of the capacitor C30. Therefore, according to this embodiment, the length of the transmission line L35 can be about ½ to ⅓ the λ/4 line. Consequently, the size of the high-frequency power amplifier 100 is smaller than the conventional one.

Because the length of the transmission line L35 is about ½ to ⅓ the λ/4 line, the resistance component of the transmission line L35 drops to about ½ to ⅓ the resistance component of the λ/4 line. Consequently, loss of the DC current from the DC power supply 132 is reduced by high efficiency current being supplied to the transistor Tr. Further, the voltage amplitude of the high-frequency signal from the transistor Tr is increased so that the distortion component is decreased, thereby an excellent linear motion is obtained.

The above-described effect becomes more remarkable as the length of the transmission line L35 becomes smaller. Particularly, an evident effect is generated when the length of the transmission line L35 is less than ½ the λ/4 line.

The characteristic of the parallel-resonant circuit 170 becomes incapable of achieving a large impedance at the time of resonance as the inductor L20 is shorter due to influences of the parasitic resistance possessed by the chip part of the capacitor C30 and the parasitic resistance component of the inductor L20. As a result, the power supplying circuit 130 becomes non-negligible with respect to the fundamental signal, so that loss occurs or the fundamental-signal matching circuit 120 is affected so that its performance deteriorates. This deterioration arises in a region in which the length of the transmission line L35 is shorter than ⅓ the λ/4 line. Thus, preferably, the length of the transmission line L35 is set at least ⅓ or more than the λ/4 line. However, because frequency dependency is noticed in the degree of this deterioration of the performance, its shortest length is never limited.

The harmonic matching circuit 140 resonates with for example, the frequency of the secondary harmonic and the parallel-resonant circuit 170 resonates with the frequency of the fundamental signal. In this case, the ratio in inductance between the inductor L20 and the inductor L30 is about 3:1 as introduced from the expressions 2, 3 (n=2). According to this embodiment, the capacitor C30 only has to be connected to a position which separates the transmission line L35 to about 3:1. In case where the harmonic matching circuit 140 resonates with the frequency of the nth-order harmonic, the ratio in inductance between the inductor L20 and the inductor L30 is $(n^2-1)$: 1 (n is an integer).

Because parasitic inductance possessed by the chip parts in the capacitor C30 and inductance component possessed by the gold wire 105 exist in an actual circuit, inductance necessary for the inductor L30 is decreased. Thus, in the actual circuit, the ratio may be sometimes larger than $(n^2-1)$: 1.

Although the conventional high-frequency power amplifiers 600, 700 need to be provided with the harmonic matching circuit 40 separately, according to this embodiment, the harmonic matching circuit 140 is formed of the inductor L30 and capacitor C30 built in the power supply circuit 130. Thus, according to this embodiment, the harmonic matching circuit 40 does not have to be provided as a separate part or a separate circuit. Therefore, the output-matching circuit 160 is formed in a smaller module than the conventional one, so that the size of the high-frequency power amplifier 100 can be reduced.

The high-frequency power amplifier 100 operates as follows. A high-frequency signal (not shown) amplified by the transistor Tr is transmitted from the output pad to the output-matching circuit 160 through the gold wire 105. This high-frequency signal contains not only the fundamental signal but also secondary and tertiary harmonic and higher-order harmonic. Because, when such harmonic leaks outside, it becomes electromagnetic wave disturbing other radio systems, the harmonic component needs to be removed from the high-frequency signal.

Because the harmonic matching circuit 140 is a series-resonant circuit comprised of the inductor L30 and the capacitor C30, the secondary harmonic is short-circuited at the node 150 so as to remove the secondary harmonic from the high-frequency signal. The parallel-resonant circuit 170 comprised of the inductor L20 and the capacitor C30 has so high an impedance that the power supplying circuit 130 can be neglected with respect to the fundamental signal at the node 150. Therefore, the fundamental signal can advance to the fundamental-signal matching circuit 120 without being affected by the power supplying circuit 130. Consequently, according to this embodiment, after the harmonic component is reduced without affecting the fundamental signal component, the high-frequency signal can be transmitted to the fundamental-signal matching circuit 120.

The fundamental-signal matching circuit 120 outputs after matching the high-frequency signal to a predetermined impedance. At this time, the high-frequency signal is filtered by the inductor L10 and the capacitor C10, and its DC current is blocked by the capacitor C40.

Figure 2:
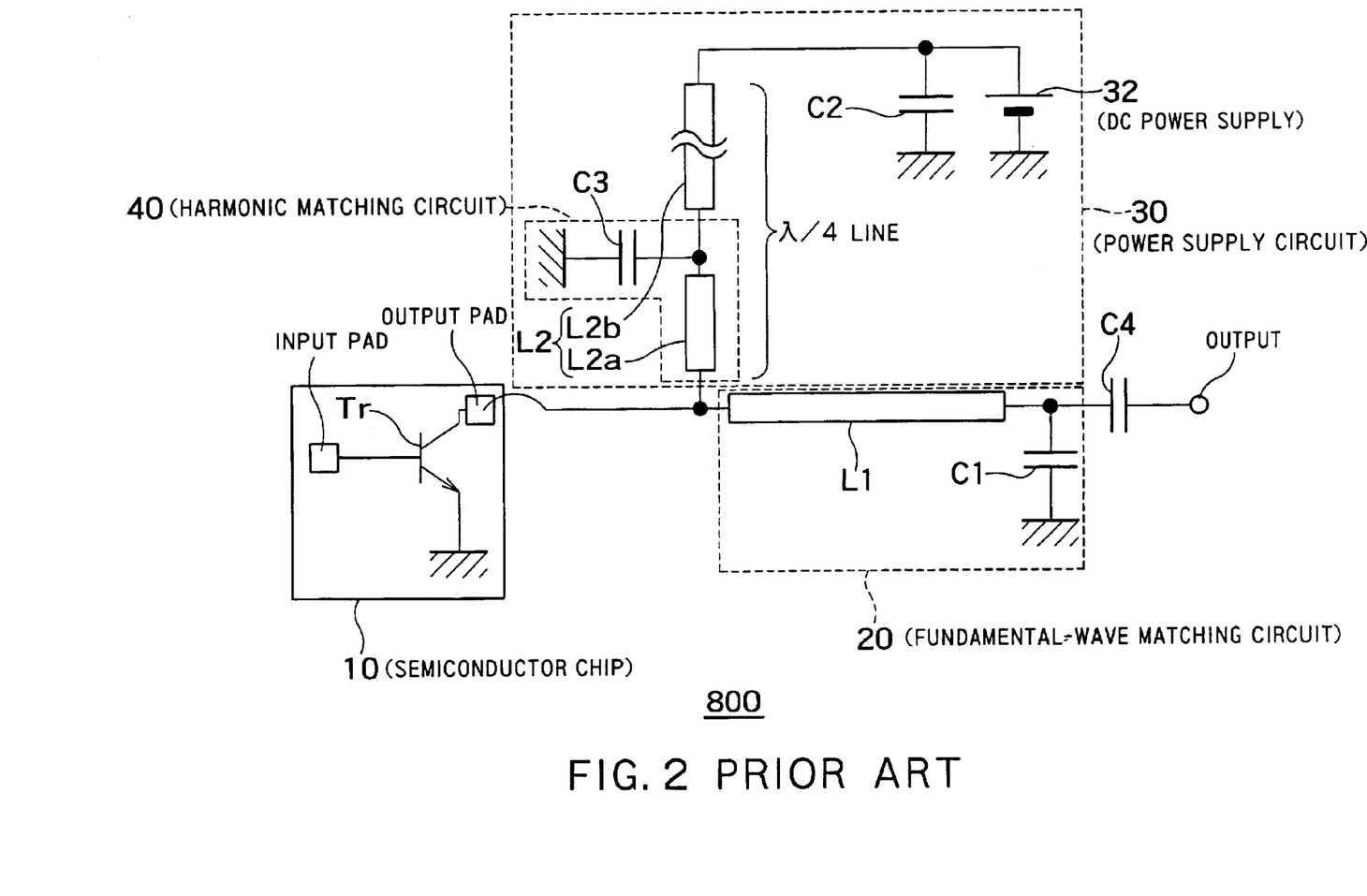
FIG. 2 is a circuit diagram of a high-frequency power amplifier 800 substantially equivalent to the high-frequency power amplifier described in Japanese Patent Application Laid-Open No.HEI11-127045(1999)

FIG. 2 is a circuit diagram of a high-frequency power amplifier 800 substantially equivalent to the high-frequency power amplifier described in Japanese Patent Application Laid-Open No.HEI11-127045(1999). The high-frequency power amplifier 100 is similar to the high-frequency power amplifier 800 at a glance.

However, the transmission line L2 of the high-frequency power amplifier 800 is the λ/4 line. This publication says that if the transmission line L2 is less than λ/4, it is not negligible from the viewpoint of the impedance of the fundamental frequency, and so it has an influence. Further, only the capacitor C3 is employed as an element of the harmonic matching circuit 40.

On the other hand, the transmission line 35 of the high-frequency power amplifier 100 according to the instant embodiment is about ½ to ⅓ the λ/4. The capacitor C30 is used in common as the elements of the harmonic matching circuit 140 and the parallel-resonant circuit 170.

The above-described effect is obtained when the transmission line 35 is about ½ to ⅓ the λ/4 line. Even if the transmission line 35 is about ½ to ⅓ the λ/4 line, the fundamental signal is not affected by the power supplying circuit 130 because the parallel-resonant circuit 170 is comprised of the inductor L20 and the capacitor C30.

Figure 3:
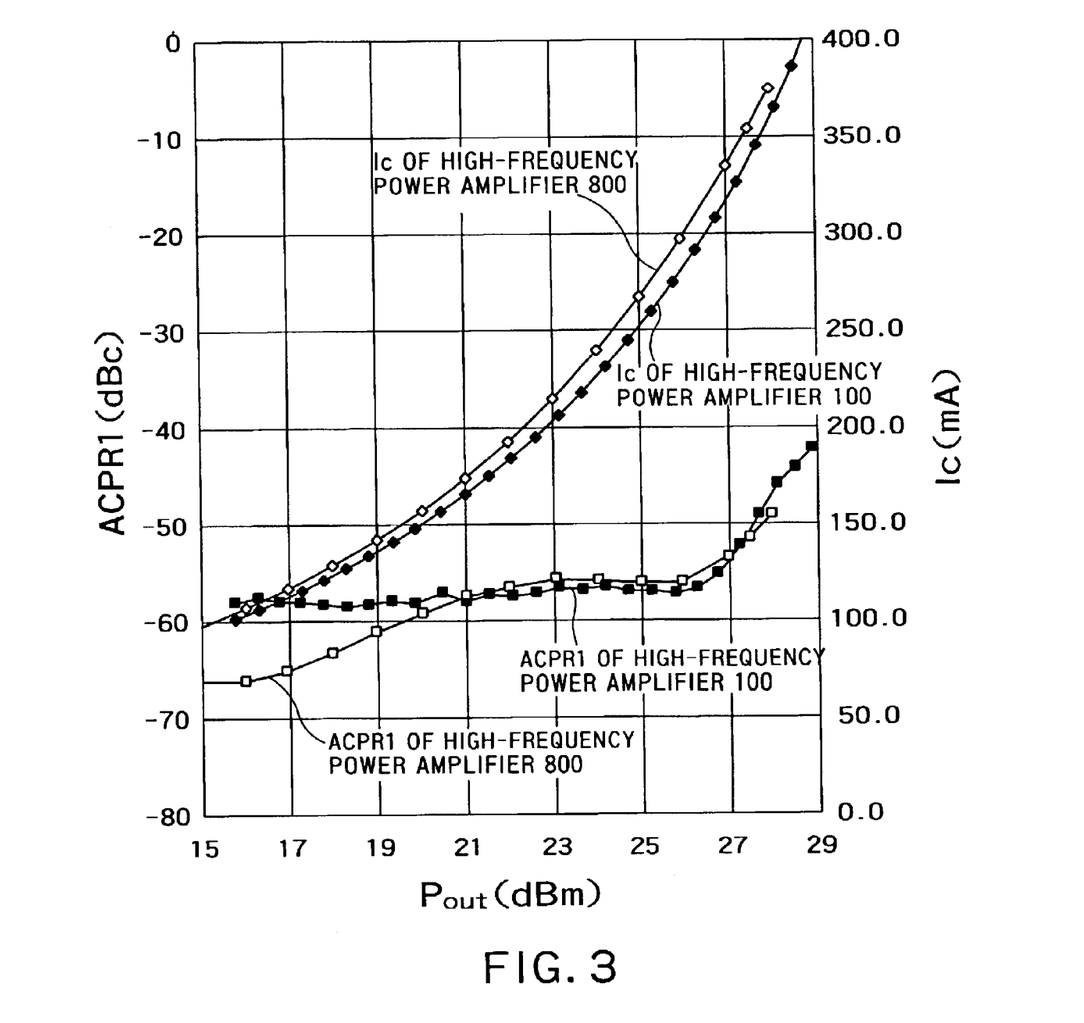
FIG. 3 is a graph of ACPR1 and Ic of the high-frequency power amplifier 100 and the high-frequency power amplifier 800.

FIG. 3 is a graph for comparing the primary-adjacent-channel leakage power ratio (ACPR1) and consumption current (Ic) of each of the high-frequency power amplifier 100 and the high-frequency power amplifier 800. The abscissa axis indicates output power (Pout).

This graph indicates a result of the case where the high-frequency power amplifier 100 or the high-frequency power amplifier 800 is constructed as a power amplifier for IS-95 (Interim Standard-95) signal in 900 MHz band. The length of the transmission line L2 of the high-frequency power amplifier 800 is about 32 mm. The capacity of the capacitor C3 is 7 pF and the length of the inductor L2a is about 1.5 mm.

On the other hand, the capacity of the capacitor C30 of the high-frequency power amplifier 100 is 6 pF, the length of the inductor L30 is about 2.3 mm and the length of the inductor L20 is about 9.2 mm. The reason why these lengths are different while its ratio is 1:3 is that the length of the inductor L30 is shortened due to influences of the inductance components of the chip part of the capacitor C30 and the gold wire 105. Consequently, the impedance of the power supplying circuit 130 relative to the fundamental signal can be adjusted to about 1 kΩ, and the impedance to the secondary harmonic can be made substantially zero (short-circuiting state).

Generally, it is preferable to keep the primary adjacent channel leakage power ratio (ACPR1) less than −50 dBc for the IS-95. As shown in FIG. 3, if the ACPR1 is less than −50 dBc, the maximum output power is about 27.5 dBm for the high-frequency power amplifier 100 and the high-frequency power amplifier 800.

If consumption currents (collector current Ic of the transistor Tr) are compared when the output power is about 27.5 dBm, that of the high-frequency power amplifier 100 is lower by about 10 mA than that of the high-frequency power amplifier 800. That is, it is found that the high-frequency power amplifier 100 has a smaller consumption current than the high-frequency power amplifier 800, thereby producing a higher effectiveness.

Figure 4:
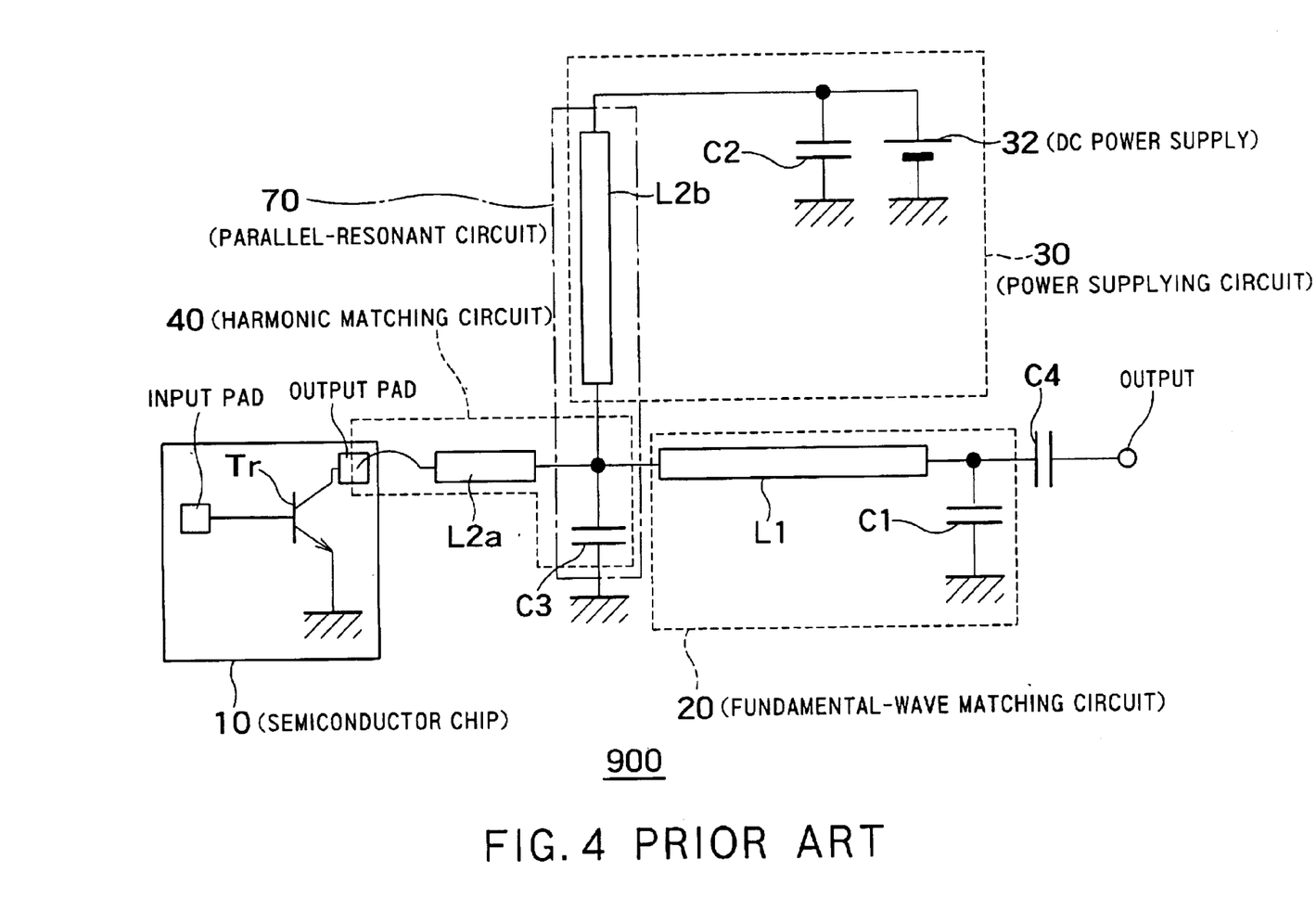
FIG. 4 is a circuit diagram of a high-frequency power amplifier 900 substantially equivalent to the amplifying circuit described in Japanese Patent Application Laid-Open No.HEI4-77009(1992)

FIG. 4 is a circuit diagram of the high-frequency power amplifier 900 substantially equivalent to the amplifying circuit disclosed in Japanese Patent Application Laid-Open No.HEI4-77009 (1992). The high-frequency power amplifier 900 contains the capacitor C3 used in common by the harmonic matching circuit 40 and the parallel-resonant circuit 70.

However, the inductance L2a of the high-frequency power amplifier 900 is connected in series between the semiconductor chip 10 and the fundamental signal matching circuit 20. That is, the fundamental-signal matching circuit 20 is connected in the middle of the inductance L2a and the capacitor C3 which construct the series-resonant circuit. Therefore, before the harmonic (for example, secondary harmonic) is short-circuited due to resonance between the inductance L2a and the capacitor C3, it leaks to the fundamental-signal matching circuit 20.

On the other hand, in the high-frequency power amplifier 100 shown in FIG. 1, the inductor L10, the capacitor C10, the inductor L30 and the capacitor C30 are connected in parallel between the node 150 and the ground. Therefore, harmonic (for example, secondary harmonic) is short-circuited by the series-resonant circuit comprising the inductor L30 and the capacitor C30, so that it does not leak to the fundamental-signal matching circuit 120.

Figure 5:
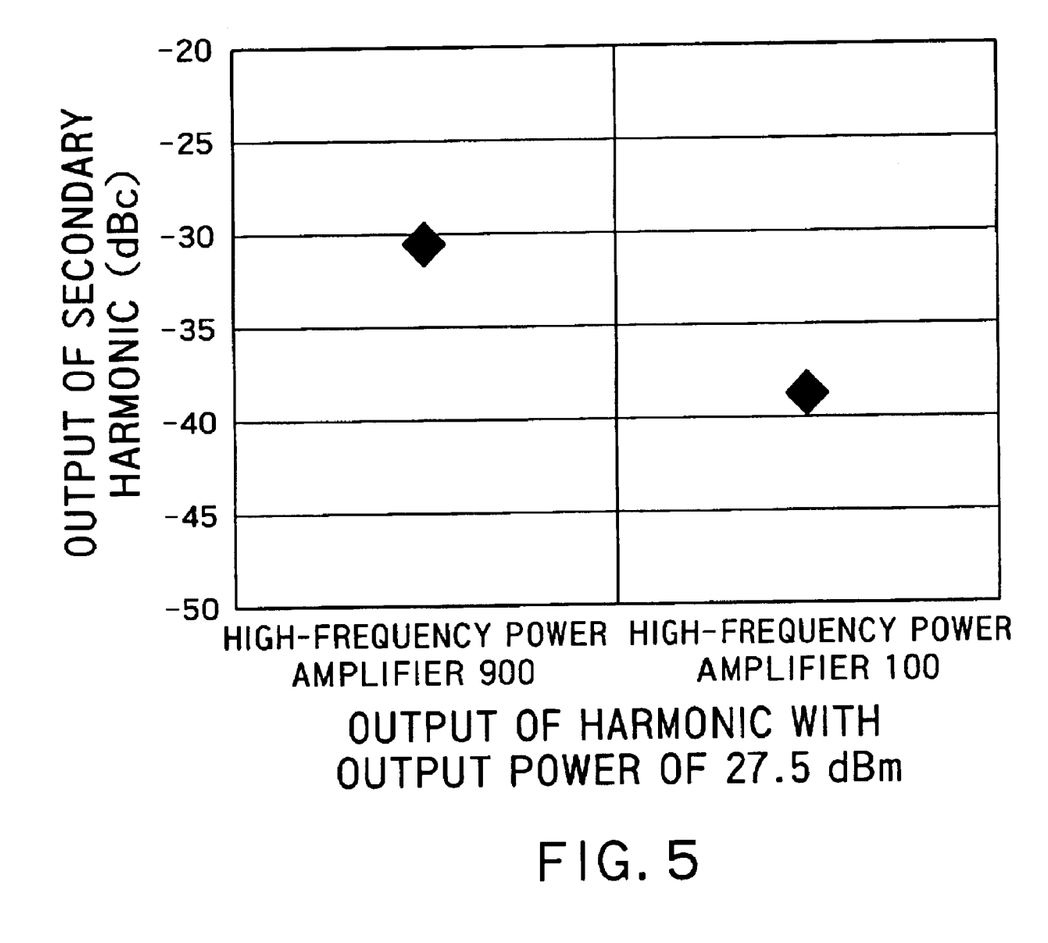
FIG. 5 is a graph for comparing the secondary harmonic waves of the high-frequency power amplifier 100 and the high-frequency power amplifier 900.

FIG. 5 is a graph for comparing the outputs of the secondary harmonic from the high-frequency power amplifier 100 and the high-frequency power amplifier 900. As evident from this graph, the output of the secondary harmonic from the high-frequency power amplifier 100 is lower by about 8 dBc than that from the high-frequency power amplifier 900. The dBc indicates dB value relative to the fundamental signal output. −8 dBc is equivalent to a reduction of about 84%. In other words, in the high-frequency power amplifier 100, leakage of the secondary harmonic to its fundamental-signal matching circuit 120 is lower by about 84% than in the high-frequency power amplifier 900. In the meantime, this graph shows the output of the secondary harmonic when the output power is 27.5 dBm.

Figure 6:
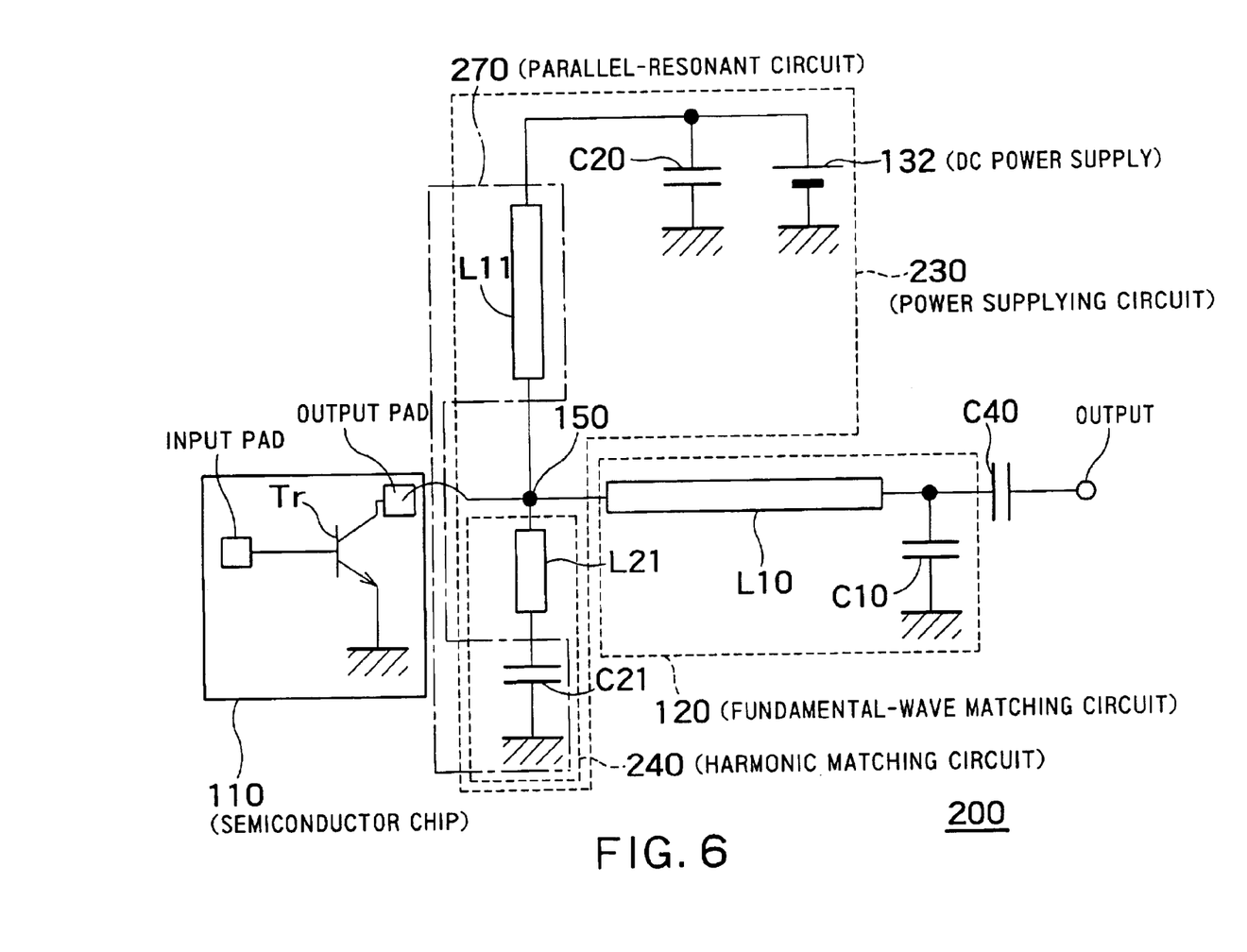
FIG. 6 is a circuit diagram of a high-frequency power amplifier 200 according to a second embodiment of the present invention.

FIG. 6 is a circuit diagram of the high-frequency power amplifier 200 according to a second embodiment of the present invention. This embodiment is different from the first embodiment in that no capacitor C30 is provided and the inductor L21 and the capacitor C21 are connected in series to the ground from the node 150.

According to this embodiment, the inductor L21 and the capacitor C21 construct the harmonic matching circuit 240 as a series-resonant circuit so as to short-circuit the secondary harmonic. The inductor L11 and the capacitor C21 construct the parallel-resonant circuit 270, so that the impedance of the fundamental-signal to the power supplying circuit 230 at the node 150 is increased.

The inductor L11 and the capacitor C21 are set up so as to resonate with the frequency of the fundamental signal.

In more in detail, the inductance $L_{21}$ of the inductor L21 and the capacity $C_{21}$ of the capacitor C21 may be determined depending on the frequency of the harmonic. For example, in case of short-circuiting the nth-order harmonic, the relation between the angular frequency $\omega_n$, the inductance $L_{21}$ and the capacity $C_{21}$ of the nth-order harmonic is expressed by the expression 4.

$$L_{21}=1/(n^{2}*\omega_{1}^{2}*C_{21}) \quad \text{(Expression 4)}$$

where $\omega_n = n*\omega_1$: $\omega_1$ is the angular frequency of the fundamental signal.

If an appropriate capacity $C_{21}$ usable in a chip part is selected as the capacity of the capacitor C21, the inductor L21 can be determined appropriately based on the expression 4.

The inductance $L_{11}$ of the inductor L11 may be determined based on a fact that the impedance in the frequency of the fundamental signal as viewed from the node 150 to the power supplying circuit 230 is infinite (open). For example, the relation between the angular frequency $\omega_1$, the inductance L11, and the capacity $C_{21}$ of the fundamental signal is expressed with the expression 5.

$$L_{11}=(n^{2}-1)/(n^{2}*\omega_{1}^{2}*C_{21}) \quad \text{(Expression 5)}$$

The capacitor C21 is used in common for the high-frequency matching circuit 140 and the parallel-resonant circuit 170. Therefore, because the capacity $C_{21}$ is already determined by the expression 4, the inductance $L_{21}$ may be determined appropriately based on the expression 5.

For example, in case of short-circuiting the secondary harmonic, each capacity and inductance only have to be determined so as to satisfy the expressions 4, 5 under n=2.

At this time, as the capacity of the capacitor C21, a usable capacity of a chip part, for example, several pF is selected. Because the value of the inductor L11 decreases as the capacity value of the capacitor C21 increases, the length of the inductor L11 can be set small by selecting an appropriate capacity value. Because the length of the inductor L21 is $1/(n^2-1)$ the length of the inductor L11 according to the expressions 4, 5, the entire length can be shortened.

Comparing the expressions 2, 3 with the expressions 4, 5, according to this embodiment, the size of the inductor L11 is $(n^2-1)/n^2$ that of the inductor L35 shown in FIG. 1. Therefore, although the circuit area is increased by addition of the high-frequency matching circuit 240, the entire area of the power supplying circuit 230 is not increased so much as compared to the embodiment shown in FIG. 1.

This embodiment includes both the high-frequency matching circuit 240 and the parallel-resonant circuit 270. Although the length of the transmission line L11 is shorter than that of the λ/4 line, the parallel-resonant circuit 170 is capable of securing a sufficiently high impedance with respect to the fundamental signal and the harmonic matching circuit 240 is capable of short-circuiting nth-order harmonic. Further, the same effect as the first embodiment can be obtained.

Figure 7:
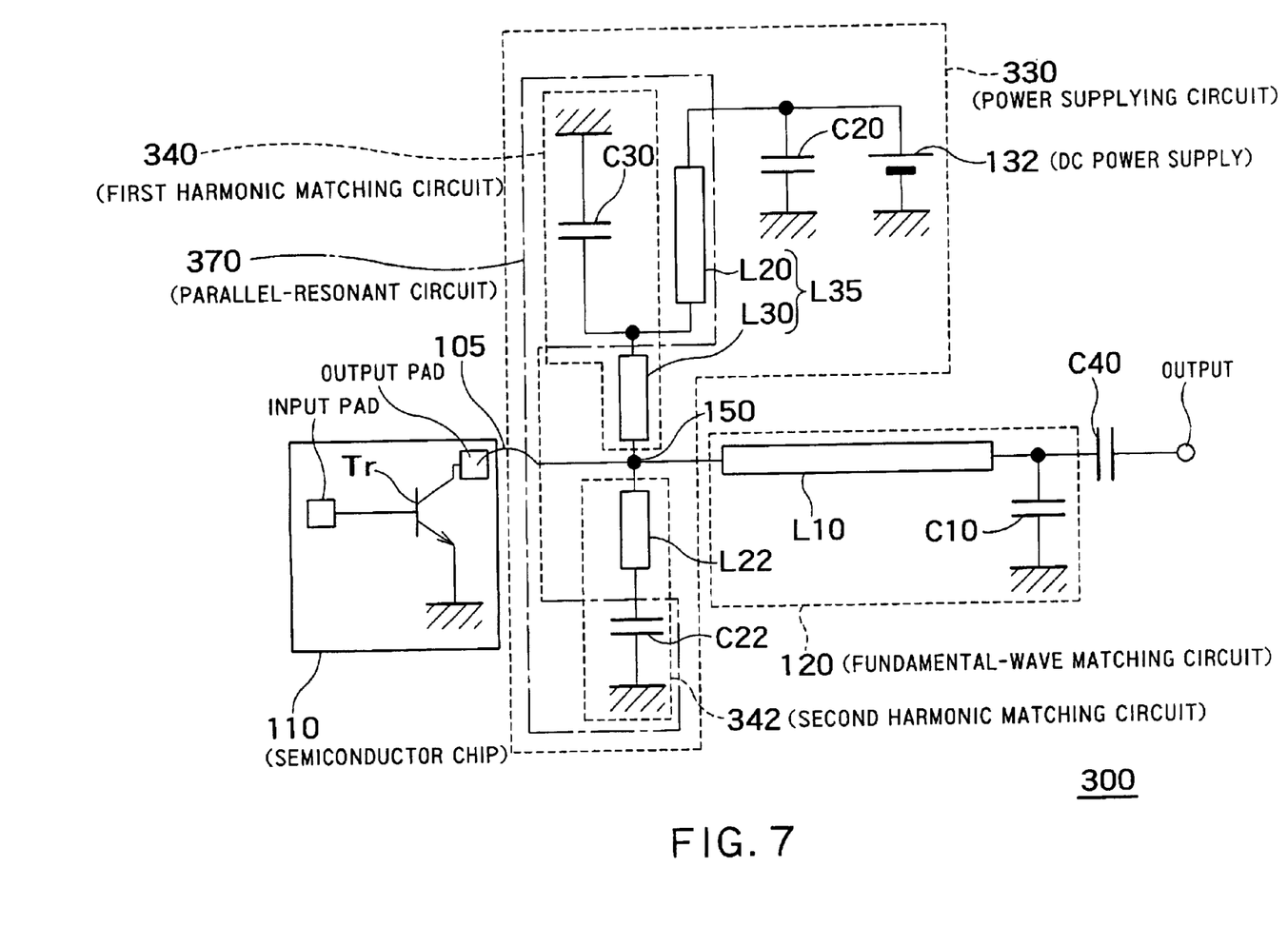
FIG. 7 is a circuit diagram of a high-frequency power amplifier 300 according to a third embodiment of the present invention.

FIG. 7 is a circuit diagram of the high-frequency power amplifier according to a third embodiment of the present invention. This embodiment is different from the first embodiment in that the inductor L22 and the capacitor C22 connected in series to the ground from the node 150 are added. The inductor L22 and the capacitor C22 construct a series-resonant circuit as a second harmonic matching circuit 342. The second harmonic matching circuit 342 is capable of matching higher order harmonic which the first harmonic matching circuit 340 is incapable of matching. For example, the first harmonic matching circuit 340 short-circuits the secondary harmonic and the second harmonic matching circuit 342 short-circuits the tertiary harmonic. Consequently, the high-frequency signal having fewer harmonic than the first embodiment can be outputted.

In more detail, if the fundamental signal of 900 MHz band is employed, the impedance of the tertiary harmonic can be short-circuited by setting the inductor L22 to about 2.0 mm and the capacitor C22 to 3 pF.

According to this embodiment, a parallel-resonant circuit 370 contains not only the inductor L20 and the capacitor C30 but also the capacitor C22. That is, the inductor L20 and the capacitors C30, C22 form the parallel-resonant circuit 370, thereby increasing the impedance of the power supplying circuit 330 to the fundamental signal.

The magnitude of the inductors L30, L22 and the magnitude of the capacitors C30, C22 are dependent on each other. Therefore, the design of the high-frequency power amplifier 300 is more complicated than the first embodiment. However, recent progress in simulation technology has enabled the estimation of the impedance of the power supplying circuit 330 with respect to the transistor Tr. Therefore, it is not difficult to find the constants of the inductor L30, L22 and the capacitors C30, C22 so that the impedance of the power supplying circuit 330 with respect to the fundamental signal at the node 150 is substantially equal to the first embodiment.

This embodiment enables the output of a high-frequency signal having fewer harmonic components than the first embodiment by means of the second harmonic matching circuit 342. According to this embodiment, the length of the transmission line L35 containing the inductors L20, L30 is less than half that of the λ/4 line because the parallel-resonant circuit 370 is adopted although it has more components than the first embodiment. Therefore, this embodiment can be formed in a small size like the first embodiment. Further, according to this embodiment, its consumption current is small, thereby securing a high power efficiency.

It is permissible to provide an additional series-resonant circuit (not shown) between the node 150 and the ground in parallel with the second harmonic matching circuit 342. Therefore, harmonic higher than third-order harmonic may be also short-circuited.

Figure 8:
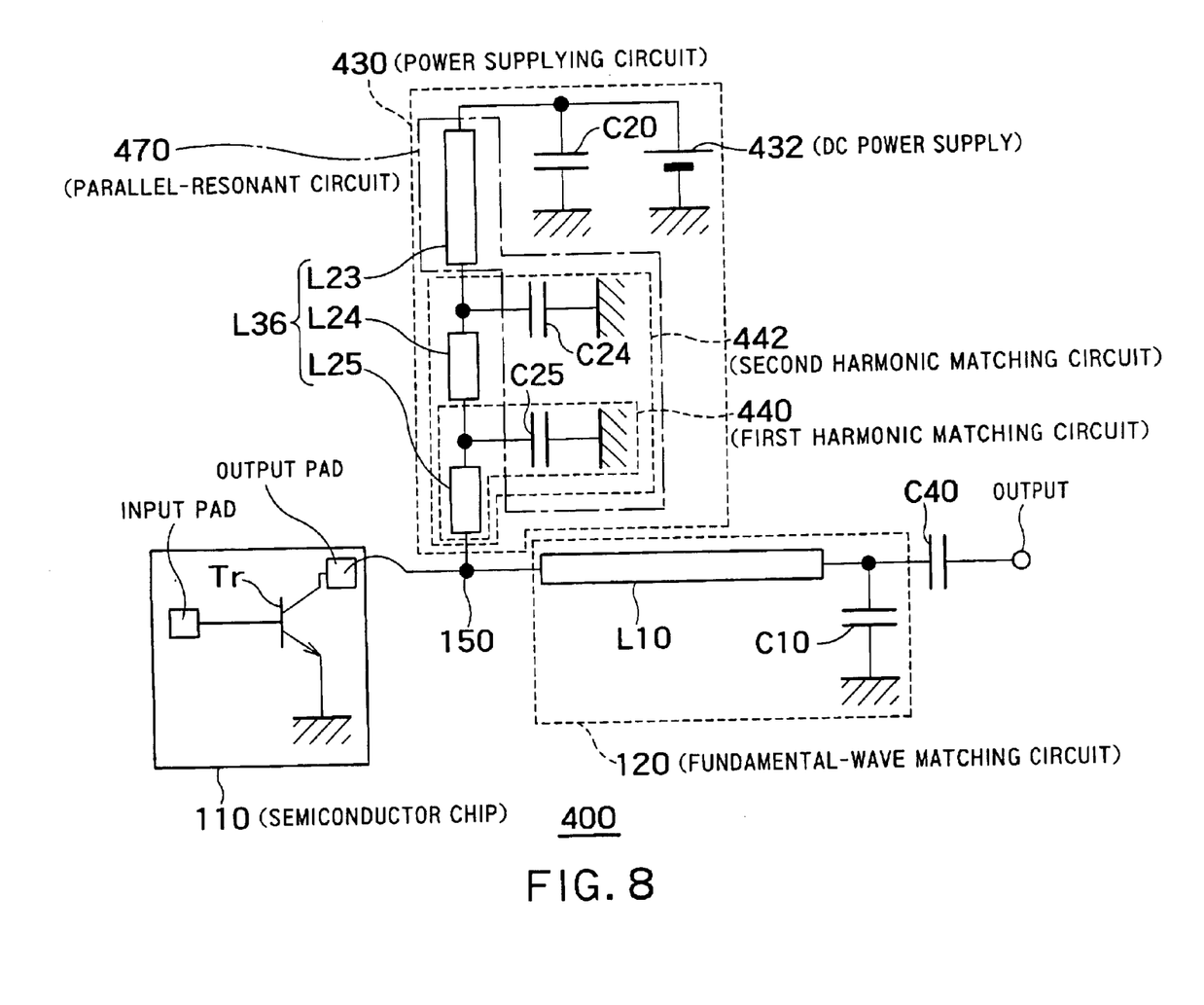
FIG. 8 is a circuit diagram of a high-frequency power amplifier 400 according to a fourth embodiment of the present invention.

FIG. 8 is a circuit diagram of the high-frequency power amplifier 400 according to a fourth embodiment of the present invention. According to this embodiment, plural capacitors C24, C25 are connected halfway on an integrated transmission line L36 within a power supplying circuit 430. Thus, the transmission line L36 is separated to three inductors L23, L24, L25.

According to the first embodiment, the single capacitor C30 is connected halfway on the transmission line L35. Therefore, the first embodiment includes the single harmonic matching circuit 140 (see FIG. 1). However, according to this embodiment, the inductor L25 and the capacitor C25 construct a series-resonant circuit as a first harmonic matching circuit 440. Further the inductors L25, L24 and the capacitor C24 construct a series-resonant circuit as a second harmonic matching circuit 442. Furthermore, the capacitors C24, C25 and the inductor L23 construct a parallel-resonant circuit 470.

According to the third embodiment, the transmission line for the inductor L22 needs to be provided as well as the transmission line L35 so as to form the second harmonic matching circuit 342 (see FIG. 7). According to this embodiment, because part of the transmission line L36 is used as the second harmonic matching circuit 442, no transmission line but the transmission line L36 has to be formed.

The high-frequency power amplifying circuit 400 of this embodiment is capable of short-circuiting the secondary harmonic and the tertiary harmonic by means of the first harmonic matching circuit 440 and the second harmonic matching circuit 442. Because this embodiment utilizes the parallel-resonant circuit 470, the length of the power supply line is less than half the length of the λ/4 line. Therefore, the high-frequency power amplifying circuit 400 can be formed in a smaller size than the conventional one. Further, because the high-frequency power amplifying circuit 400 does not need to be provided with any other transmission line than the transmission line L36, it can be formed smaller than the third embodiment. Further, this embodiment ensures a much higher power efficiency than the third embodiment.

This embodiment includes high-frequency matching circuits for the secondary harmonic and the tertiary harmonic. However, higher-order harmonic can be short-circuited by connecting an additional capacitor to the transmission line 36 like the capacitors C24, C25. In this case, the constants of the inductor and capacitor only should be adjusted so as to achieve a parallel-resonant circuit on the fundamental-signal.

Figure 9:
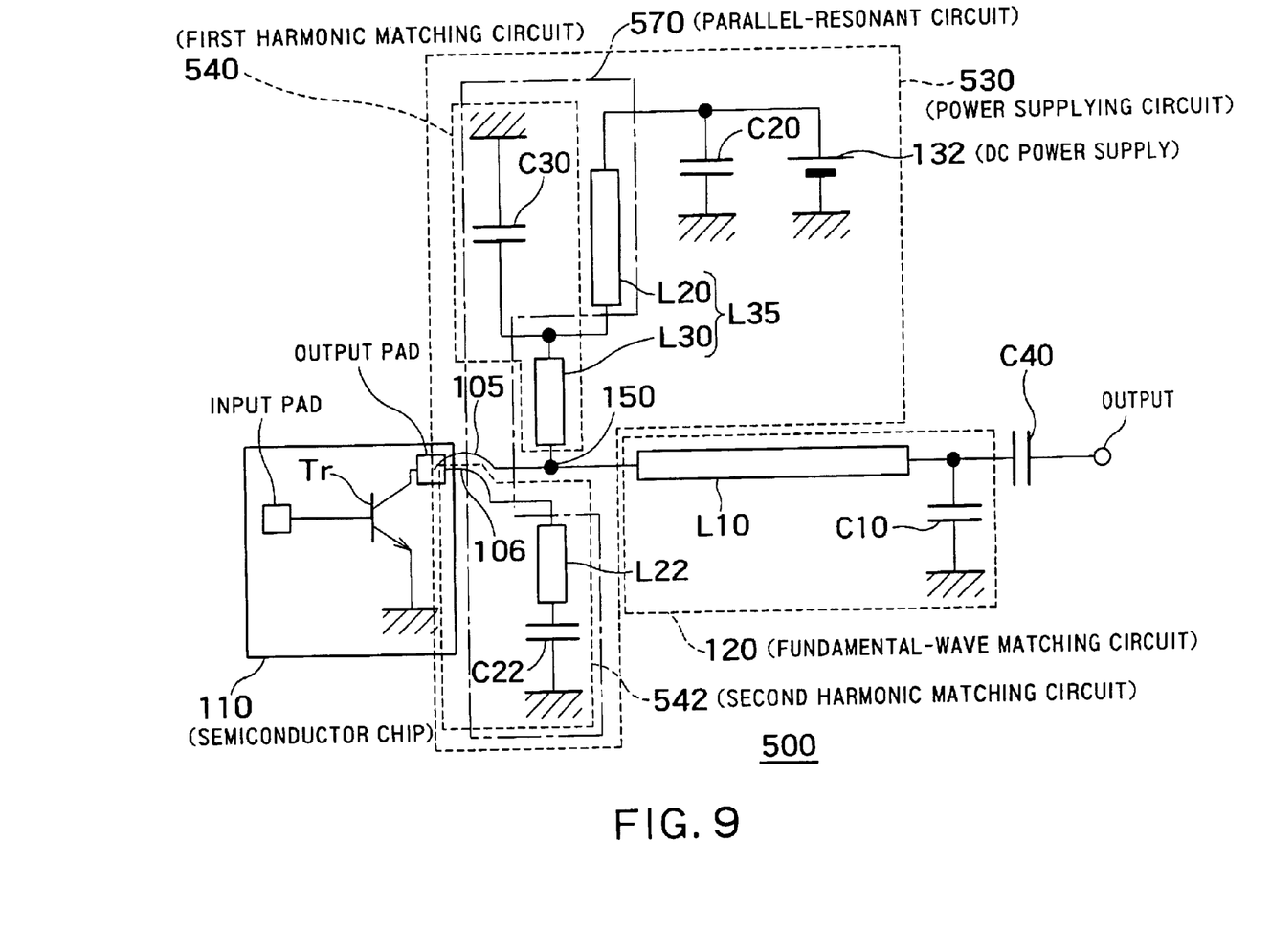
FIG. 9 is a circuit diagram of a high-frequency power amplifier 500 according to a fifth embodiment of the present invention.

FIG. 9 is a circuit diagram of the high-frequency power amplifier 500 according to a fifth embodiment of the present invention. According to this embodiment, the second harmonic matching circuit 542 is not connected to the node 150, but connected directly to the output pad of the semiconductor chip 110 through the gold wire 106. The other configuration is the same as the third embodiment.

According to the third embodiment, because the second harmonic matching circuit 342 is connected to the node 150, the inductance from the output pad to the node 150 cannot short-circuit the tertiary harmonic completely. The reason is that inductance from the output pad to the node 150 performs the same action as the inductor L2a shown in FIG. 4.

According to this embodiment, inductance from the output pad to the inductor L22 through the gold wire 106 is contained in the inductance component of the second harmonic matching circuit 542. Therefore, the tertiary harmonic can be short-circuited more completely than in the third embodiment.

If plural series-resonant circuits are provided, by connecting all the series-resonant circuits not to the node 150 but directly to the output pad of the transistor Tr, not only the tertiary harmonic but also the secondary harmonic and higher-order harmonic can be short-circuited completely.

The high-frequency power amplifier according to the above-described embodiment has a high power efficiency and is capable of matching secondary and higher order harmonic and the size thereof can be formed smaller.

What is claimed is:

1. A high-frequency power amplifier comprising:
    a transistor which is inputted with a high-frequency signal, amplifies the high-frequency signal and outputs the same;
    a fundamental-signal matching circuit, one end of which is connected to an output of said transistor and which matches at least the impedance of fundamental signal in the amplified high-frequency signal and outputs the same from the other end;
    a power supply which supplies electric power to said transistor from a node located in an interval from the output of said transistor to said fundamental-signal matching circuit;
    a first inductor, one end of which is connected to said power supply;
    a second inductor connected in series between the other end of said first inductor and said node; and
    a first capacitor, one end of which is connected between said first inductor and said second inductor while the other end thereof is connected to a reference potential, said first capacitor forming a first series-resonant circuit with said second inductor and a parallel-resonant circuit with said first inductor.

2. The high-frequency power amplifier according to claim 1,
    wherein said first series-resonant circuit and said fundamental-signal matching circuit are connected in parallel between said node and said reference voltage.

3. The high-frequency power amplifier according to claim 1,
    wherein the ratio in inductance between said first inductor and said second inductor is about ($n^2-1$): 1 (n is an integer) and the sum of the lengths of transmission lines for forming said first inductor and said second inductor is ⅛ the wavelength of the fundamental signal or less.

4. The high-frequency power amplifier according to claim 2,
    wherein the ratio in inductance between said first inductor and said second inductor is about ($n^2-1$): 1 (n is an integer) and the sum of the lengths of transmission lines for forming said first inductor and said second inductor is ⅛ the wavelength of the fundamental signal or less.

5. The high-frequency power amplifier according to claim 1,
    wherein said first inductor and said second inductor form an integrated transmission line,
    wherein the ratio in inductance between said first inductor and said second inductor is determined by the ratio of the length of the transmission line between said first inductor and said second inductor.

6. The high-frequency power amplifier according to claim 2,
    wherein said first inductor and said second inductor form an integrated transmission line,
    wherein the ratio in inductance between said first inductor and said second inductor is determined by the ratio of the length of the transmission line between said first inductor and said second inductor.

7. The high-frequency power amplifier according to claim 3,
    wherein said first inductor and said second inductor form an integrated transmission line,
    wherein the ratio in inductance between said first inductor and said second inductor is determined by the ratio of the length of the transmission line between said first inductor and said second inductor.

8. The high-frequency power amplifier according to claim 1 further comprising:
    a third inductor which is connected in series between said second inductor and said node, said third inductor forming said first series-resonant circuit with said second inductor and said first capacitor; and
    a second capacitor, one end of which is connected between said second inductor and said third inductor while the other end thereof is connected to the reference potential, said second capacitor forming a second series-resonant circuit with said third inductor and forming a parallel-resonant circuit with said first capacitor and said first inductor.

9. The high-frequency power amplifier according to claim 8, wherein
    said first inductor, said second inductor and said third inductor form an integrated transmission line and
    the ratio in inductance among said first inductor, said second inductor and said third inductor is determined by the ratio in the length of the transmission line among said first inductor, said second inductor and said third inductor.

10. A high-frequency power amplifier comprising:
    a transistor which is inputted with a high-frequency signal, amplifies the high-frequency signal and outputs the same;
    a fundamental-signal matching circuit one end of which is connected to an output of said transistor and which matches at least the impedance of fundamental signal in the amplified high-frequency signal and outputs the same from the other end;
    a power supply which supplies electric power to said transistor from a node located in an interval from the output of said transistor to said fundamental-signal matching circuit;
    a first inductor, one end of which is connected to said power supply;
    a second inductor connected in series between the other end of said first inductor and said node;
    a third inductor, one end of which is connected to said node; and
    a first capacitor, one end of which is connected to the other end of said third inductor while the other end thereof is connected to said reference potential, said first capacitor forming a first series-resonant circuit with said third inductor and a parallel-resonant circuit with said first inductor.

11. A high-frequency power amplifier comprising:
a transistor which is inputted with a high-frequency signal, amplifies the high-frequency signal and outputs the same;
a fundamental-signal matching circuit, one end of which is connected to an output of said transistor and which matches at least the impedance of fundamental signal in the amplified high-frequency signal and outputs the same from the other end;
a power supply which supplies electric power to said transistor from a node located in an interval from the output of said transistor to said fundamental matching circuit;
a first inductor, one end of which is connected to said power supply;
a second inductor connected is series between the other end of said first inductor and said node;
a third inductor, one end of which is connected to the output of said transistor; and
a first capacitor, one end of which is connected to the other end of said third inductor while the other end thereof is connected to said reference potential, said first capacitor forming a first series-resonant circuit with said third inductor and a parallel-resonant circuit with said first inductor.

12. The high-frequency power amplifier according to claim 10, wherein the sum of the lengths of said first inductor and said second inductor is ⅛ the wavelength of the fundamental signal or less.

13. The high-frequency power amplifier according to claim 11, wherein the sum of the lengths of said first inductor and said second inductor is ⅛ the wavelength of the fundamental signal or less.

14. The high-frequency power amplifier according to claim 10, further comprising a second capacitor, one end of which is connected between said first inductor and said second inductor while the other end thereof is connected to said reference potential, said second capacitor forming a second series-resonant circuit with said second inductor and a parallel-resonant circuit with said first capacitor and said first inductor.

15. The high-frequency power amplifier according to claim 11, further comprising a second capacitor one end of which is connected between said first inductor and said second inductor while the other end thereof is connected to said reference potential, said second capacitor forming a second series-resonant circuit with said second inductor and a parallel-resonant circuit with said first capacitor and said first inductor.

16. The high-frequency power amplifier according to claim 10, wherein said first inductor, said second inductor and said third inductor form an integrated transmission line and the ratio in inductance among said first inductor, said second inductor and said third inductor is determined by the ratio in the length of the transmission line among said first inductor, said second inductor and said third inductor.

17. The high-frequency power amplifier according to claim 11, wherein said first inductor, said second inductor and said third inductor form an integrated transmission line and the ratio in inductance among said first inductor, said second inductor and said third inductor is determined by the ratio in the length of the transmission line among said first inductor, said second inductor and said third inductor.

18. The high-frequency power amplifier according to claim 5, wherein said transmission line is a strip line or a micro strip line.

19. The high-frequency power amplifier according to claim 9, wherein said transmission line is a strip line or a micro strip line.

20. The high-frequency power amplifier according to claim 16, wherein said transmission line is a strip line or a micro strip line.

21. The high-frequency power amplifier according to claim 17, wherein said transmission line is a strip line or a micro strip line.

* * * * *